United States Patent
Summerfield et al.

(10) Patent No.: US 12,355,474 B2
(45) Date of Patent: Jul. 8, 2025

(54) ENHANCED DPD METHOD TO CORRECT GAIN FLATNESS FOR WIRELESS COMMUNICATIONS SYSTEMS

(71) Applicant: Analog Devices, Inc., Wilmington, MA (US)

(72) Inventors: Stephen Summerfield, Santa Clara, CA (US); Sefa Tanis, North Chelmsford, MA (US)

(73) Assignee: ANALOG DEVICES, INC., Wilmington, MA (US)

(*) Notice: Subject to any disclaimer, the term of this patent is extended or adjusted under 35 U.S.C. 154(b) by 386 days.

(21) Appl. No.: 17/741,448

(22) Filed: May 11, 2022

(65) Prior Publication Data

US 2022/0376714 A1    Nov. 24, 2022

Related U.S. Application Data

(60) Provisional application No. 63/187,372, filed on May 11, 2021.

(51) Int. Cl.
| | |
|---|---|
| *H04B 1/04* | (2006.01) |
| *H04L 25/49* | (2006.01) |
| *H04L 27/26* | (2006.01) |
| *H04L 27/36* | (2006.01) |

(52) U.S. Cl.
CPC ............ *H04B 1/04* (2013.01); *H04L 25/49* (2013.01); *H04L 27/2695* (2013.01); *H04L 27/367* (2013.01); *H04B 2001/0425* (2013.01)

(58) Field of Classification Search
CPC ... H04B 1/04; H04B 2001/0425; H04L 25/49; H04L 27/2695; H04L 27/367; H03F 1/3247; H03F 3/19; H03F 3/245; H03G 3/3042
See application file for complete search history.

(56) References Cited

U.S. PATENT DOCUMENTS

| | | |
|---|---|---|
| 7,808,315 B2 | 10/2010 | Goodman et al. |
| 9,190,963 B2 | 11/2015 | Omer et al. |
| 10,931,318 B2 | 2/2021 | Mahmood et al. |

(Continued)

FOREIGN PATENT DOCUMENTS

EP    1641132 B1    6/2007

OTHER PUBLICATIONS

International Search Report and Written Opinion received for PCT Patent Application No. PCT/US2022/028751, mailed on Aug. 19, 2022, 9 pages.

*Primary Examiner* — Vineeta S Panwalkar
(74) *Attorney, Agent, or Firm* — ArentFox Schiff LLP

(57) ABSTRACT

In a dynamic signal traffic scenario, a narrowband to wideband transition in a DPD system results in a tilt in the output spectrum until the next DPD adaptation cycle occurs. To address this problem, regularization term is applied with a weighing factor when performing DPD coefficient estimation and adaptation. The regularization term can be obtained from in a variety of ways: using pre-stored waveforms, through factory or in-situ calibration, or through an adaptive or opportunistic update by observing the system. Application of the regularization term improves the spectrum flatness for a narrow to wideband signal transition, and does not require transmitting additional calibration tones to correct the gain flatness.

19 Claims, 7 Drawing Sheets

(56) References Cited

U.S. PATENT DOCUMENTS

2016/0079932 A1\* 3/2016 Martynovich .......... H03F 3/189
 330/149
2020/0336117 A1 10/2020 Li et al.
2022/0302937 A1\* 9/2022 Cheng ....................... H03F 3/24

\* cited by examiner

ENHANCED DPD METHOD TO CORRECT GAIN FLATNESS FOR WIRELESS COMMUNICATIONS SYSTEMS

PRIORITY APPLICATION

This patent application receives benefit from and claims priority to US provisional application having the same title as this patent application, with Ser. No. 63/187,372, filed on May 11, 2021. The US provisional application is hereby incorporated by reference in its entirety.

TECHNICAL FIELD OF THE DISCLOSURE

The present disclosure generally relates to electronics, and, more specifically, to performing digital predistortion (DPD) in radio frequency (RF) systems.

BACKGROUND

RF systems are systems that transmit and receive signals in the form of electromagnetic waves in the RF range of approximately 3 kilohertz (kHz) to 300 gigahertz (GHz). RF systems are commonly used for wireless communications, with cellular/wireless mobile technology being a prominent example, but may also be used for cable communications such as cable television. In both of these types of systems, linearity of various components therein plays a crucial role.

Linearity of an RF component or a system such as an RF transceiver is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency and/or output power.

Made from semiconductor materials, which are inherently nonlinear, and having to operate at relatively high power levels, power amplifiers (PAs) are usually the first components to analyze when considering a design of an RF system in terms of linearity. PA outputs with nonlinear distortions can result in reduced modulation accuracy (e.g., reduced error vector magnitude (EVM)) and/or out-of-band emissions. Therefore, both wireless RF systems (e.g., Long Term Evolution (LTE) and millimeter-wave or 5th generation (5G) systems) and cable RF systems have stringent specifications on PA linearity.

DPD can be applied to enhance linearity of a PA. Typically, DPD involves applying, in the digital domain, predistortion to a signal to be provided as an input to a PA to reduce and/or cancel distortion that is expected to be caused by the PA. The predistortion can be characterized by a PA model. The PA model can be updated based on the feedback from the PA (i.e., based on the output of the PA). The more accurate a PA model is in terms of predicting the distortions that the PA will introduce, the more effective the predistortion of an input to the PA will be in terms of reducing the effects of the distortion caused by the amplifier.

Performing DPD in RF systems is not an easy task because a variety of factors can affect the cost, quality, and robustness of DPD. Physical constraints such as space/surface area and also regulations can pose further constraints to the requirements or specifications of DPD. DPD becomes particularly challenging because of ever-increasing sampling rates used in state-of-the-art RF systems, and thus trade-off and ingenuity have to be exercised in designing DPD.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
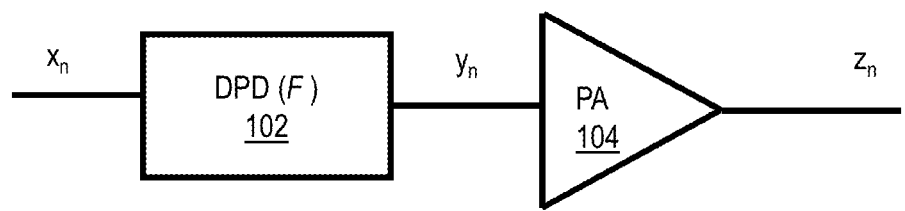
FIG. 1 is a block diagram illustrating an RF system having DPD with gain flatness correction and a PA, according to some embodiments of the disclosure.

In a dynamic signal traffic scenario, a narrowband to wideband transition in a DPD system results in a tilt in the output spectrum until the next DPD adaptation cycle occurs. To address this problem, regularization term is applied with a weighing factor when performing DPD coefficient estimation and adaptation. The regularization term can be obtained from in a variety of ways: using pre-stored waveforms, through factory or in-situ calibration, or through an adaptive or opportunistic update by observing the system. Application of the regularization term improves the spectrum flatness for a narrow to wideband signal transition, and does not require transmitting additional calibration tones to correct the gain flatness.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating DPD with gain flatness correction, proposed herein, it might be useful to first understand phenomena that may come into play in RF systems. The following foundational information may be viewed as a basis from which the present disclosure may be properly explained. Such information is offered for purposes of explanation only and, accordingly, should not be construed in any way to limit the broad scope of the present disclosure and its potential applications.

As described above, PAs are usually the first components to analyze when considering a design of an RF system in terms of linearity. Having linear and efficient PAs is essential for wireless and cable RF systems. While linearity is also important for small-signal amplifiers such as low-noise amplifiers, the challenges of linearity are particularly pronounced for PAs because such amplifiers are typically required to produce relatively high levels of the output power and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating at relatively high power levels (i.e., operating in saturation) also typically function at their highest efficiency, which is highly desirable. As a result, linearity and efficiency (or power level) are two performance parameters for which, often, an acceptable trade-off has to be found in that an improvement in terms of one of these parameters comes at the expense of the other parameter being suboptimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Thus, reducing the input power may provide an improvement in terms of linearity but results in a decreased efficiency of the amplifier.

As also described above, DPD can predistort an input to a PA to reduce and/or cancel distortion caused by the amplifier. To realize this functionality, at a high level, DPD involves forming a model of how a PA may affect an input signal, the model defining coefficients of a filter to be applied to the input signal (such coefficients referred to as "DPD coefficients") in an attempt to reduce and/or cancel distortions of the input signal caused by the amplifier. In this manner, DPD will try to compensate for the amplifier applying an undesirable nonlinear modification to the signal to be transmitted, by applying a corresponding modification to the input signal to be provided to the amplifier.

Models used in DPD algorithms are typically adaptive models, meaning that they are formed in an iterative process by gradually adjusting the coefficients based on the comparison between the data that comes in to the input to the amplifier and the data that comes out from the output of the amplifier. Estimation of DPD coefficients is based on acquisition of finite sequences of input and output data (i.e., input to and output from a PA), commonly referred to as "captures," and formation of a feedback loop in which the model is adapted based on the analysis of the captures. A capture can yield a covariance matrix, which relates the input to the amplifier (as a vector) and the output to the amplifier (as another vector), and measures correlation or covariance between the input and the output. More specifically, DPD algorithms can be based on General Memory Polynomial (GMP) models (or other suitable models) that involve forming a set of polynomial equations commonly referred to as "update equations," and searching for suitable solutions to the equations, in a broad solution space, to update a model of the PA. DPD algorithms can operate on the covariance matrix to determine DPD coefficients that can predistort the input to yield a linear PA. To that end, DPD algorithms solve an inverse problem, which is the process of calculating, from a set of observations (e.g., the covariance matrix), the casual factors that produced these observations.

Problem of Gain Tilt when Transitioning from Narrowband to Wideband

In a dynamic signal traffic scenario, a narrowband to wideband transition in a DPD system results in a tilt in the output spectrum until the next DPD adaptation cycle occurs. The DPD is trained on the narrowband waveform. Once the DPD is trained, and the signal traffic transitions to high power wideband waveform, the DPD would try to equalize or suppress the previously unseen out-of-band portion of the signal. This results in a tilt in the output spectrum until the next DPD adaptation cycle happens (until the DPD trains on the wideband signal at the next cycle or update).

Some systems may transmit a calibration tone so that the DPD is trained on the narrowband as well as the calibration tone covering the entire band of interest. This method improves gain flatness and the adjacent channel leakage ratio (ACLR) along with it. However, transmitting additional tones is not acceptable in every market or region.

TABLE 0

Summary of Issues

Issue in a dynamic multiple-input multiple-output (MIMO) radio scenario
  DPD trains on the narrowband channel-state information reference signal
  (CSI-RS)
  Then the radio traffic changes to a wideband high-power waveform
  The gain is tilted until the next DPD adaptation cycle
Impact:
  Throughput:
    Symbol power in the affected regions is not accurate
  The equalizer at the receiver would not be able to compensate for such severe gain flatness issues
  Beamforming Calibration:
    Beamforming/antenna calibration estimations are wrong
Some systems may:
  Transmit an additional calibration waveform along with CSI-RS
  DPD trains on this wideband waveform
  Narrowband to wideband transition is smoother
  However, transmitting additional calibration tone is not desirable/ permitted in every region Exemplary DPD Methods to Correct Gain Flatness By including a regularization term to the least squares solution of the DPD, it is possible to flatten the output spectrum. This regularization term (or constraint function term) can include the high power wideband target waveform to be used in the application. The regularization term can be computed from regularization data representing wideband input and output of an amplifier. Therefore, the optimum DPD coefficients are estimated for the mixture of narrowband and wideband waveform (as opposed to just the narrowband waveform). The mixture can be formed using an appropriate weighing factor. When the radio traffic changes from narrowband to wideband, DPD with this regularization term would not have the tilt issue (or tilting is significantly alleviated). The additional term serves as a regularization technique and can maintain gain flatness in a dynamic signal environment, especially when a calibration tone cannot be transmitted.

FIG. 1 is a block diagram illustrating an RF system having DPD 102 with gain flatness correction and a PA 104, according to some embodiments of the disclosure. $x_n$ is the input to the DPD 102 applying a function F. $y_n$ is the predistorted signal, i.e., the output of the DPD 102, as a result of applying function F on the input $x_n$. $z_n$ is the output of the PA 104, as a result of receiving the predistorted signal $y_n$.

TABLE 1

Example DPD Formulation A

Goal of DPD is to optimize min $|z - FC|^2$ with additional constraints on a metric applied to the model output with a pre-stored input Xw.
Modified cost function for the optimization problem: min $|y - F(x)C|^2 + \beta H(F(Xw))$
  $\beta H(F(Xw))$ is the additional regularization term or constraint function term
  Xw: Pre-stored input
  F: DPD model function
  H: A constraint function
  $\beta$: Scaling factor or weighing factor
  C: DPD Coefficients
Minimize the cost function including the regularization term
  $|y - FC|^2 + \beta |Xw - F(Xw)C|^2$
Solve DPD including the wideband high-power Tx waveform information
  The goal in a typical least square solution is to minimize the cost function $|y - FC|^2$
  Include the $\beta H(F(Xw)) = \beta |Xw - F(Xw)C|^2$ term to regularize the overall DPD solution
  The regularization term improves the spectrum flatness for a narrowband to wideband signal transition in a DPD system
  This method does not require transmitting additional calibration tones to correct the gain flatness

TABLE 2

Example DPD Formulation B

Minimize this cost function which included a regularization term: $|z - FC|^2 + \beta |w - F(w)C|^2$
  $\beta |w - F(w)C|^2$ is the additional regularization term or constraint function term
  w is the regularization signal/data included in the estimation by a vector W which can be obtained in different ways
  F: DPD model function
  $\beta$: Scaling factor or weighing factor
  C: DPD Coefficients
  When $\beta = 0$ (i.e., normal DPD without regularization), the least squares solution is $C = (F^H F^H)^{-1}(F^H Y)$, where F is the matrix of DPD terms computed on Z, so that F can be applied on Y. Coefficients C can be found from captures of y and z (the predistorted input sequence and the output sequence respectively), represented as vector Y [the Tx vector] and vector Z [the Rx vector]
  With a regularization term, the least squares solution is $C = (F^H F^H + G^H G^H)^{-1}(F^H Y + G^H W)$ where G is the matrix of DPD terms computed over W
    W can be chosen to represent the typical signal that is transmitted during wideband operation
    G characterizes what happens in the amplifier when a wideband signal is processed
    G is calculated in the same predistortion model as F (i.e., same dimension)
    If G is absent, the least squares solution matches normal DPD without regularization
  The regularization term improves the spectrum flatness for a narrowband to wideband signal transition in a DPD system
  This method does not require transmitting additional calibration tones to correct the gain flatness Referring back to Table 2, G is a matrix of DPD terms computed for a wideband signal, characterizing how a wideband signal behaves through the PA. G can be computed from regularization data, and the regularization data be retrieved/obtained in different ways.

In some embodiment, a pre-stored waveform that represents a wideband input signal being processed by the PA can be pre-calculated (e.g., assuming linear behavior) and stored as regularization data. Pre-stored waveform can assume Tx=Rx=W. G can be computed from the pre-stored waveform (i.e., the regularization data).

In some embodiments, a pre-determined wideband signal is provided as input to the PA (alone, when the PA is taken offline from transmitting normal data traffic, or in lab, or in factory), and the wideband input signal and output signal are stored as a capture (i.e., the regularization data, or Z(W)). G can be computed from the capture, or compute G on Z. G can be kept and stored in the DPD system.

In some embodiments, the data traffic to the PA is monitored (or sensed at a suitable point in the signal chain) to determine if the data traffic is sufficiently wideband. If the data traffic is sufficient wideband, then the input signal and output signal are stored as a capture (i.e., the regularization data). G can be computed from the capture in an opportunistic or adaptive fashion. Fast Fourier Transform (FFT) of the data traffic can measure bandwidth to allow for the determination of whether the data traffic is sufficiently wideband. In 4G or 5G systems, if a cell is near maximum power, it is likely that the cell is transmitting a sufficiently wideband signal. High power usage can be detected and wideband data is likely being transmitted via the PA.

$\beta$ is a weighing factor that can be determined experimentally. A small value for $\beta$ may not achieve much gain flatness correction. However, if $\beta$ is too big, $\beta$ can negatively impact DPD.

Regularization data, as used herein, can refer to input and output data that corresponds to a wideband signal being processed by the PA, or input and output data corresponding to wideband operation of the PA. In some cases, regularization data can refer to DPD coefficients calculated from the input and output data (using the same model that yields F). In some cases, regularization data has information that characterizes behavior of the PA in wideband operation. Regularization data can be calculated/determined. Regularization data can be measured by putting the PA in wideband operation. Regularization data can be sensed while the PA is in wideband operation.

Exemplary RF System with DPD Gain Flatness Correction

Figure 2:
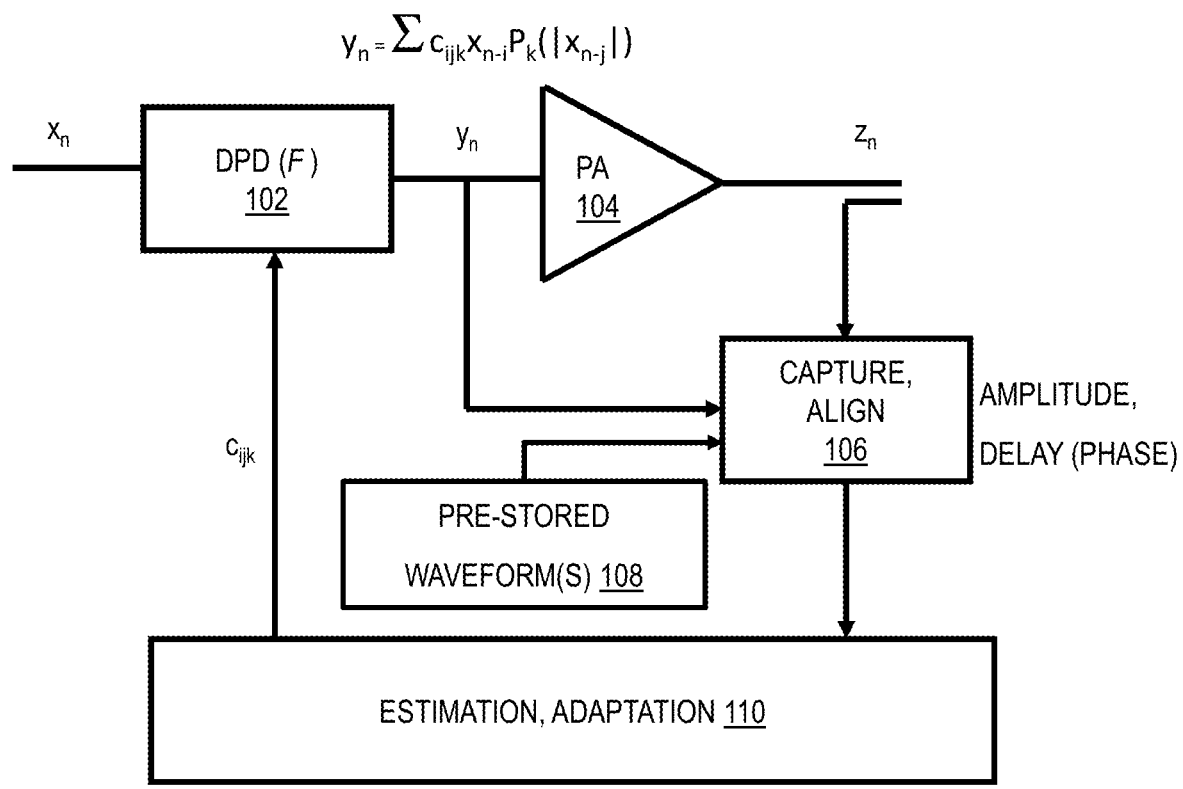
FIG. 2 is a block diagram illustrating a RF system having DPD with gain flatness correction, a PA, capture and align circuit, pre-stored waveform(s), and estimation and adaptation circuit, according to some embodiments of the disclosure.

FIG. 2 is a block diagram illustrating a RF system having DPD 102 with gain flatness correction, a PA 104, capture and align circuit 106, pre-stored waveform(s) 108, and estimation and adaptation circuit 110, according to some embodiments of the disclosure. Besides taking $y_r$, and $z_n$ as inputs, the capture and align circuit 106 also receives pre-stored waveform(s) 108. The pre-stored waveform(s) 108 can include regularization data. In some cases, the pre-stored waveform(s) includes information or data for how the PA 104 would behave when processing wideband data traffic, which can include the high power wideband target waveform to be used in the application. Regularization or constraint term can be derived from the pre-stored waveform(s) 108, and provided to the estimation and adaptation circuit 110. Estimation and adaptation circuit 110 can compute coefficients for DPD 102.

By adding the pre-stored waveform(s) to the captures being used by the DPD estimation and adaptation circuit to compute DPD coefficients C, an additional regularization term is added to the cost function of the DPD optimization problem. In some embodiments, a number of captures are captured from $y_r$, and $z_n$, and regularization data is treated as a further capture.

Training on input and output data along with the pre-stored waveform(s) by estimation and adaptation circuit 110 adds a regularization term to the DPD optimization problem (i.e., minimizing the cost function), making the DPD 102 (more) immune to the tilting problem when transitioning between narrowband and wideband. As a result, the coefficients C computed by estimation and adaptation circuit 110 would not suppress the gain and cause tilting when going from narrowband to wideband.

Figure 3:
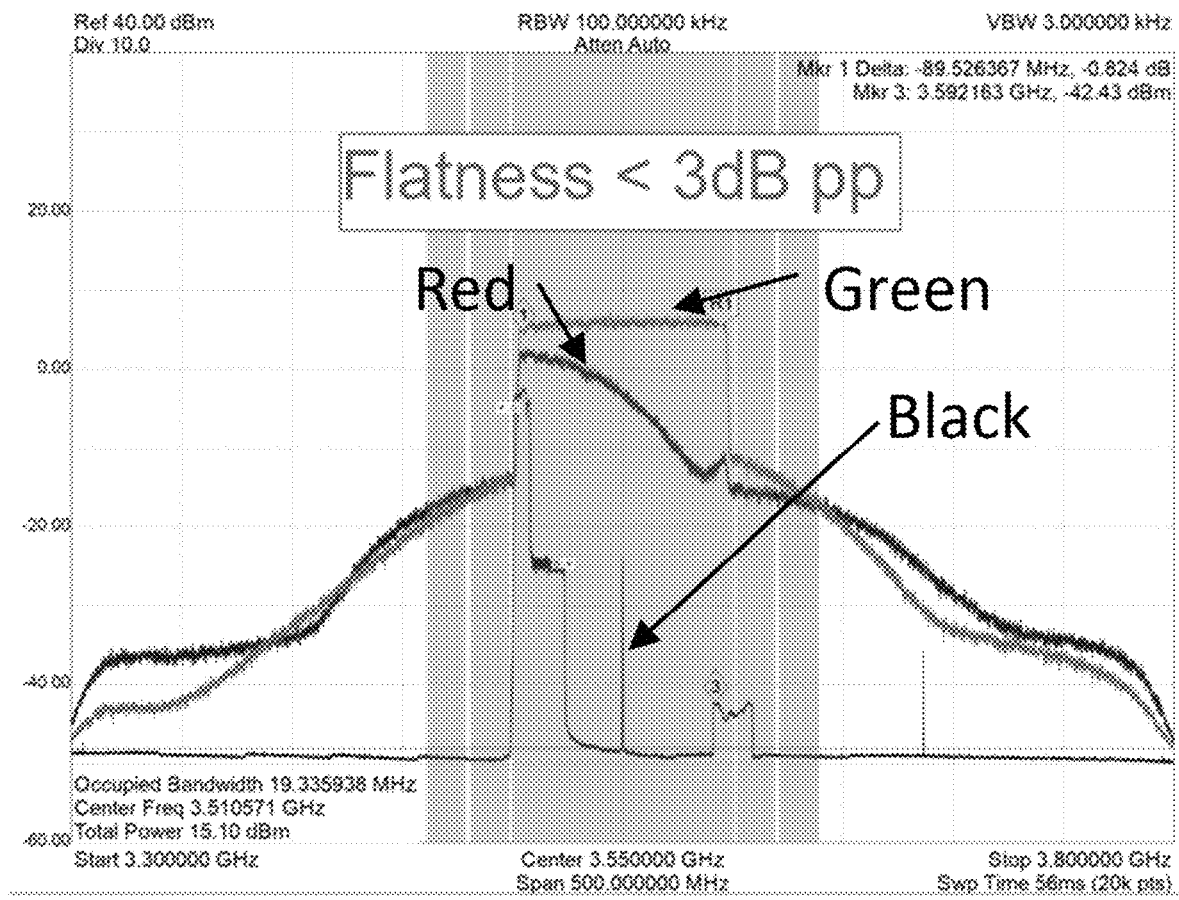
FIGS. 3 and 4 illustrate a narrowband to wideband transient response, according to some embodiments of the disclosure.
Figure 4:
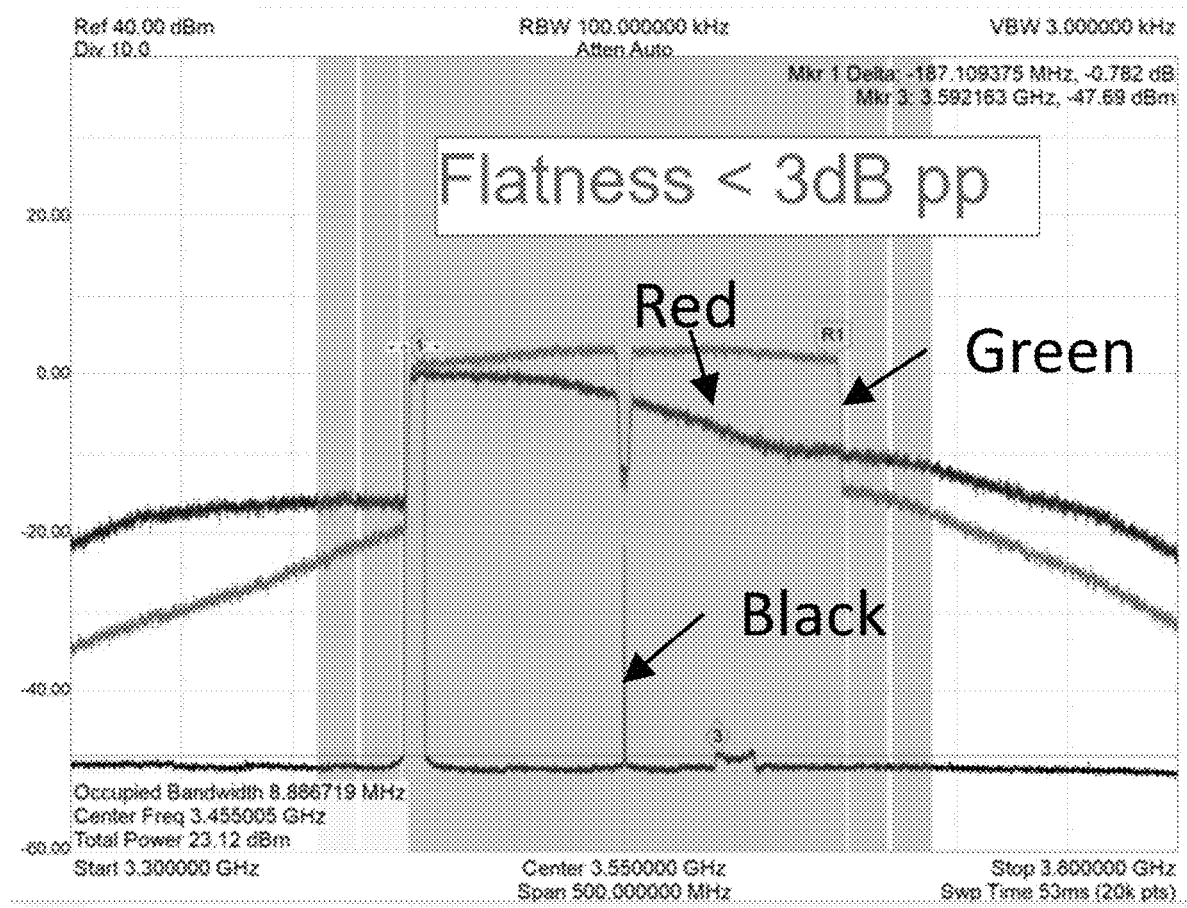

Exemplary Results on Improvement of Gain Flatness when Regularization is Applied FIGS. 3 and 4 illustrate a narrowband to wideband transient response, according to some embodiments of the disclosure. Both FIGURES illustrate that under two different scenarios of switching from narrowband to wideband, and gain flatness correction is not applied, tilting is a problem. When gain flatness correction is applied, gain is flat, and tilting is not a problem. Waveforms labeled "Green" with regularization enabled exhibits a flatter response than the waveforms labeled "Red" without regularization enabled.

Example RF Devices and Systems

DPD with gain flatness correction as described herein may be included in various RF devices and systems used in wireless or cable communications. For illustration purposes only, one example RF device that may include any of the DPD arrangements with gain flatness correction as described herein is shown in FIG. 5 and described below.

Figure 5:
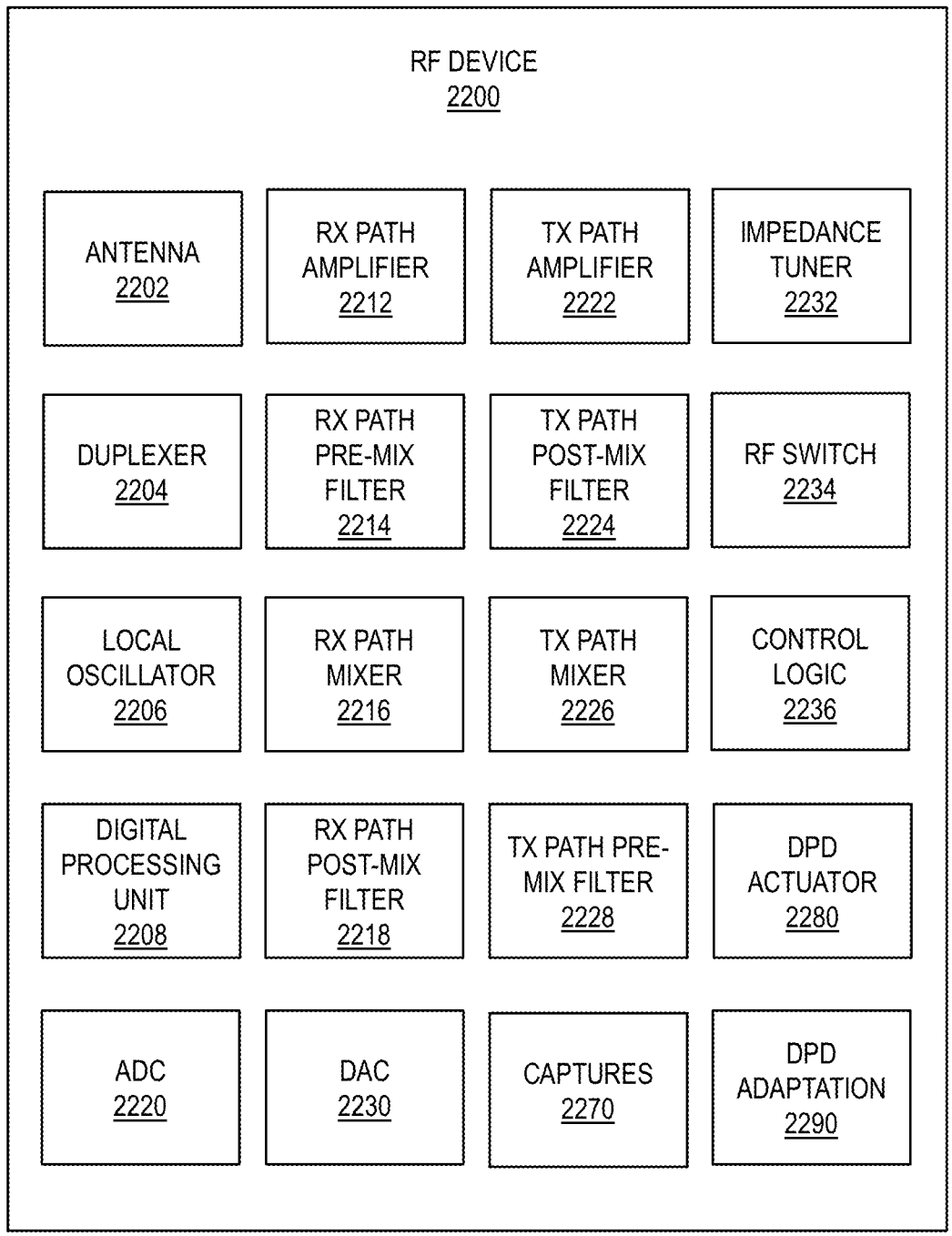
FIG. 5 provides a schematic block diagram illustrating an RF system in which DPD with gain flatness correction may be implemented, according to some embodiments of the present disclosure.

FIG. 5 is a block diagram of an example RF device 2200, e.g., an RF transceiver, in which DPD with gain flatness correction may be implemented, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI). RF device 2200 may operate dynamically and transition between narrowband operation and wideband operation.

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 5 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on-chip (SoC) die.

Additionally, in various embodiments, the RF device 2200 may not include one or more of the components illustrated in FIG. 5, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 5, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 5, the RF device 2200 may include an RX path that may include an RX path amplifier 2212, an RX path pre-mix filter 2214, a RX path mixer 2216, an RX path post-mix filter 2218, and an analog to digital converter (ADC) 2220. As further shown in FIG. 5, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 5. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 5) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 5 as control logic 2236, e.g., an RF FE control interface. In some embodiments, the control logic 2236 may be configured to control at least portions of performing DPD with gain flatness correction, as described herein, e.g., to help linearize the TX path amplifier 2222 of the RF device 2200 when the TX path amplifier 2222 includes an array of PAs, e.g., the PA 130 as described herein. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wideband antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 5, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the RX path mixer 2216 (e.g., downconverter) may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 5, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path (quadrature) mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include a PA, e.g., the PA 104 of FIGS. 1 and 2, and may be implemented together with any of the DPD arrangements with gain flatness correction as described herein, where DPD arrangements with gain flatness correction may be used to provide predistorted input signals to the TX path amplifier 2222. The DPD arrangement with gain flatness correction can include DPD (actuator) 2280 (illustrated as DPD 102 in FIGS. 1 and 2), captures 2270 (illustrated as capture and align circuit 106 and pre-stored waveform(s) 108 in FIG. 2), and DPD adaptation 2290 (illustrated as estimation and adaptation circuit 110).

In various embodiments, any of the RX path pre-mix filter 2214, the RX path post-mix filter 2218, the TX path post-mix filter 2224, and the TX path pre-mix filter 2228 may be implemented as RF filters. In some embodiments, an RF filter may be implemented as a plurality of RF filters, or a filter bank. A filter bank may include a plurality of RF filters that may be coupled to a switch, e.g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 5, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 5 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Other Exemplary Methods for DPD with Gain Flatness Correction

Figure 6:
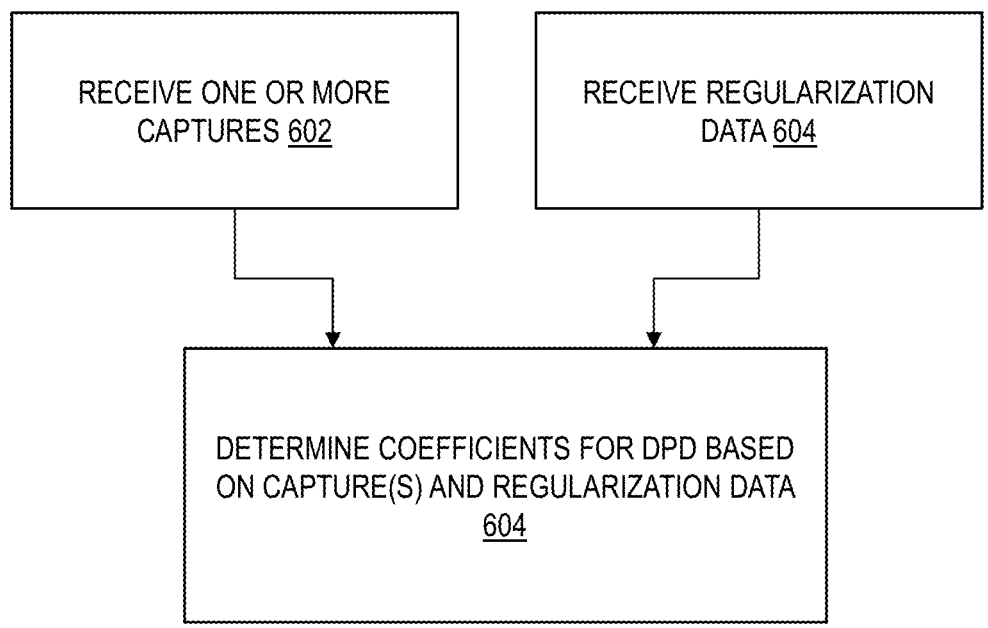
FIG. 6 is a flow diagram for an exemplary method for DPD with gain flatness correction.

FIG. 6 is a flow diagram for an exemplary method for DPD with gain flatness correction. In 602, one or more captures of a predistorted input signal (e.g., $y_n$, or vector Y) and an output signal (e.g., $z_n$, or vector Z) of the amplifier are received. In 604, regularization data corresponding to a wideband input signal and a wideband output signal of the amplifier is retrieved. In 606, coefficients (e.g., C) for predistorting an input signal to the amplifier based on the one or more captures and the regularization data are determined.

Figure 7:
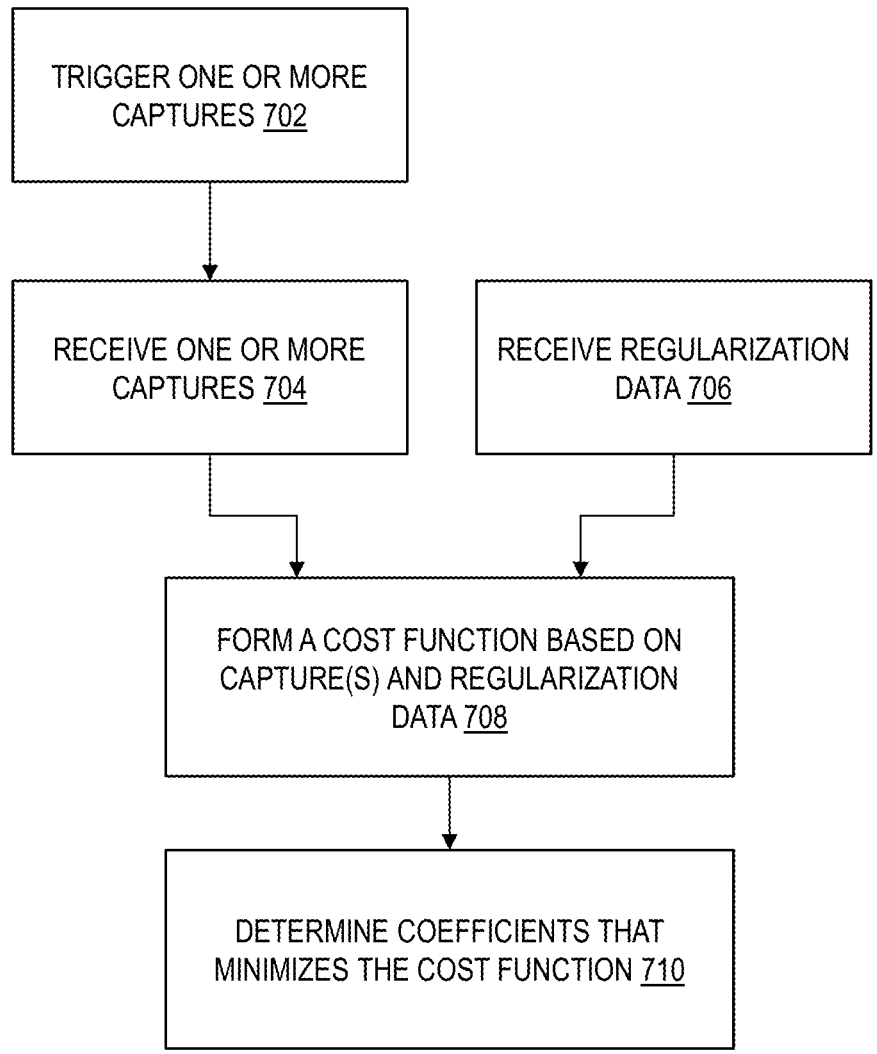
FIG. 7 is a flow diagram for another method for DPD with gain flatness correction.

FIG. 7 is a flow diagram for another method for DPD with gain flatness correction. This method can be carried out by a processor on-chip with a transmitter. The processor can execute instructions to carry out the method. In 702, one or more captures of a predistorted input signal and an output signal of the amplifier is triggered (e.g., capture and align circuit 106 of FIG. 2 can be instructed to perform one or more captures). In 704, the one or more captures are received (e.g., by estimation and adaptation circuit 110 of FIG. 2). In 706, regularization data corresponding to a wideband input signal and a wideband output signal is received (e.g., by estimation and adaptation circuit 110 of FIG. 2). In 708, a cost function based on the one or more captures and the regularization data is formed (e.g., by estimation and adaptation circuit 110 of FIG. 2). In 810, coefficients that minimizes the cost function are determined (e.g., by estimation and adaptation circuit 110 of FIG. 2), wherein the coefficients are applied to predistort an input signal to the amplifier (e.g., by DPD 102 of FIGS. 1 and 2)

Select Examples

Example 1 is a method for digital predistortion for an amplifier, the method comprising: receiving one or more captures of a predistorted input signal and an output signal of the amplifier; retrieving regularization data corresponding to a wideband input signal and a wideband output signal of the amplifier; and determining coefficients for predistorting an input signal to the amplifier based on the one or more captures and the regularization data.

In Example 2, the method of Example 1 can optionally include the regularization data being pre-stored/pre-computed data representing input and output signals received and output respectively by the amplifier during wideband operation of the amplifier.

In Example 3, the method of Example 1 or 2 can optionally include the regularization data being pre-stored data representing wideband input and output signals received and output respectively by the amplifier as if the amplifier was linear.

In Example 4, the method of Example 1 can optionally include transmitting a wideband signal through the amplifier while the amplifier is not transmitting normal data traffic; and storing, as the regularization data, a capture of the wideband signal and the output signal of the amplifier while the amplifier is transmitting the wideband signal. The wideband signal is not transmitted during normal operation of the amplifier (e.g., the amplifier is offline, in a lab, or in a factory).

In Example 5, the method of Example 1 can optionally include providing normal data traffic as input to the amplifier; detecting that the normal data traffic is or is close to being a wideband signal; storing, as the regularization data, a capture of the wideband signal and the output signal of the amplifier while the amplifier is transmitting the wideband signal.

In Example 6, the method of any one of Examples 1-5 can optionally include: retrieving one or more capture covariance matrices formed from the one or more captures; and retrieving a regularization covariance matrix formed from the regularization data.

In Example 7, the method of Example 6 can optionally include combining the one or more capture covariance matrices and the regularization covariance matrix into a joint matrix.

In Example 8, the method of Example 6 can optionally include combining the one or more capture covariance matrices and the regularization covariance matrix into a joint matrix based on a weighing factor.

In Example 9, the method of any one of Examples 1-8 can optionally include determining the coefficients comprising: determining coefficients which minimizes a cost function defined based on the one or more captures and the regularization data.

In Example 10, the method of Example 7 or 8 can optionally include determining the coefficients comprising: determining coefficients which minimizes a cost function determined based on the joint matrix.

In Example 11, the method of any one of Examples 1-10 can optionally include: predistorting input data to the amplifier based on the determined coefficients.

In Example 12, the method of any one of Examples 1-11 can optionally include one of the one or more captures corresponding to a narrowband signal, and another one of the one or more captures corresponding to a wideband signal.

In Example 13, the method of any one of Examples 1-11 can optionally include one of the one or more captures corresponding to narrowband signals only.

In Example 14, the method of any one of Examples 1-13 can optionally include: transitioning the amplifier from narrowband operation (e.g., the amplifier is in a narrowband operation, processing a narrowband signal during a first time period) to wideband operation (e.g., the amplifier is in a wideband operation, processing a wideband signal during a subsequent second time period).

Example 101 is a transmitter with gain flatness correction when transitioning from narrowband operation to wideband operation, comprising: an input; a digital predistortion function to predistort the input and generate a predistorted input; an amplifier to receive the predistorted input, amplify the predistorted input, and generate an output; data store to store (1) one or more captures of the predistorted input and the output of the amplifier and (2) regularization data; adaptation logic coupled to the data store to determine coefficients for the digital predistortion function.

In Example 102, the transmitter of Example 101 can optionally include the regularization data being pre-loaded/pre-calculated/pre-stored on the data store.

In Example 103, the transmitter of Example 101 can optionally include the regularization data being captured while the amplifier is processing a wideband signal.

In Example 104, the transmitter of Example 103 can optionally include the wideband signal processed by the amplifier being part of normal data traffic.

In Example 105, the transmitter of any one of Examples 101-104 can optionally include the adaptation logic being further to: compute a joint matrix based on (1) captures of the predistorted input and the output of the amplifier and (2) regularization data, and determine the coefficients based on the joint matrix.

In Example 106, the transmitter of any one of Examples 101-105 can optionally include the transmitter is to switch from narrowband operation to wideband operation.

In Example 107, the transmitter of any one of Examples 101-106 can optionally include the transmitter being a part of a massive input massive output radio.

Example 1001 is one or more non-transitory computer-readable media having instructions encoded thereon, the instructions executable by one or more processors to perform the following: triggering one or more captures of a predistorted input signal and an output signal of the amplifier; receiving the one or more captures; receiving regularization data corresponding to a wideband input signal and a wideband output signal; forming a cost function based on the one or more captures and the regularization data; and determining coefficients that minimizes the cost function, wherein the coefficients are applied to predistort an input signal to the amplifier.

In Example 1002, the one or more non-transitory computer-readable media of Example 1001 can optionally include the regularization data being pre-loaded/pre-calculated/pre-stored on the one or more non-transitory computer-readable media.

In Example 1003, the one or more non-transitory computer-readable media of Example 1001, further comprising: triggering the wideband input signal to be transmitted as the input signal of the amplifier; and triggering the regularization data to be captured while the wideband input signal is transmitted by the amplifier.

In Example 1004, the one or more non-transitory computer-readable media of claim 1001, further comprising: detecting that that normal data traffic being transmitted as the input signal of the amplifier represents a wideband signal; and triggering the regularization data to be captured while the normal data traffic is transmitted by the amplifier.

Example A is an apparatus comprising means to carry out any one or more of the methods of Examples 1-14.

Variations and Implementations

While some of the descriptions are provided herein with reference to PAs, in general, various embodiments of DPD with gain flatness correction, presented herein, are applicable to amplifiers other than PAs, such as low-noise amplifiers, variable gain amplifiers, etc., as well as to nonlinear electronic components of RF transceivers (i.e., components that may exhibit nonlinear behavior) other than amplifiers. Furthermore, while some of the descriptions are provided herein with reference to millimeter-wave/5G technologies, in general, various embodiments of DPD with gain flatness correction, presented herein, are applicable to wireless communication systems of any technology or standard other than millimeter-wave/5G, to any wireless RF systems other than wireless communication systems, and/or to RF systems other than wireless RF systems.

As will be appreciated by one skilled in the art, aspects of the present disclosure, in particular aspects of RF transceivers with DPD with gain flatness correction as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of DPD arrangements, RF transceivers, and/or their controllers, etc.) or be stored upon manufacturing of these devices and systems.

The following detailed description presents various descriptions of specific certain embodiments. However, the innovations described herein can be embodied in a multitude of different ways. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted. If used, the terms "substantially," "approximately," "about," etc., may be used to generally refer to being within +/−20% of a target value, e.g., within +/−10% of a target value, based on the context of a particular value as described herein or as known in the art.

While embodiments of the present disclosure were described above with references to exemplary implementations as shown in FIGS. 1-2 and 5, a person skilled in the art will realize that the various teachings described above are applicable to a large variety of other implementations. For example, descriptions provided herein are applicable not only to 5G systems, which provide one example of wireless communication systems, but also to other wireless communication systems such as, but not limited to, Wi-Fi technology or Bluetooth technology. In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to performing DPD with gain flatness correction as described herein.

Parts of various systems for performing DPD with gain flatness correction, as proposed herein, can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors (DSPs), microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in an SoC package, either in part, or in whole. An SoC represents an integrated circuit (IC) that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-2 and 5) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the spirit of the present disclosure. The description and drawings are, accordingly, to be regarded in an illustrative rather than in a restrictive sense.

It is also important to note that the functions related to performing DPD with gain flatness correction as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

What is claimed is:

1. A transmitter with gain flatness correction when transitioning from narrowband operation to wideband operation, comprising:
    an input;
    a digital predistortion function to predistort the input and generate a predistorted input;
    an amplifier to receive the predistorted input, amplify the predistorted input, and generate an output;
    data store to store (1) one or more captures of the predistorted input and the output of the amplifier and (2) regularization data, wherein the regularization data is pre-loaded on the data store; and
    adaptation logic coupled to the data store to determine coefficients for the digital predistortion function.

2. The transmitter of claim 1, wherein the regularization data is captured while the amplifier is processing a wideband signal.

3. The transmitter of claim 2, wherein the wideband signal processed by the amplifier is part of normal data traffic.

4. The transmitter of claim 1, wherein the adaptation logic is further to:
    compute a joint matrix based on (1) captures of the predistorted input and the output of the amplifier and (2) regularization data, and
    determine the coefficients based on the joint matrix.

5. The transmitter of claim 1, wherein the transmitter is to switch from narrowband operation to wideband operation.

6. The transmitter of claim 1, wherein the transmitter is a part of a massive input massive output radio.

7. One or more non-transitory computer-readable media having instructions encoded thereon, the instructions being executable by one or more processors to perform the following:
    triggering one or more captures of a predistorted input signal and an output signal of an amplifier;
    receiving the one or more captures;
    receiving regularization data corresponding to a wideband input signal and a wideband output signal;
    forming a cost function based on the one or more captures and the regularization data; and
    determining coefficients that minimizes the cost function, wherein the coefficients are applied to predistort an input signal to the amplifier.

8. The one or more non-transitory computer-readable media of claim 7, wherein the regularization data is pre-loaded on the one or more non-transitory computer-readable media.

9. The one or more non-transitory computer-readable media of claim 7, further comprising:
    triggering the wideband input signal to be transmitted as the input signal of the amplifier; and
    triggering the regularization data to be captured while the wideband input signal is transmitted by the amplifier.

10. The one or more non-transitory computer-readable media of claim 7, further comprising:
    detecting that that normal data traffic being transmitted as the input signal of the amplifier represents a wideband signal; and
    triggering the regularization data to be captured while the normal data traffic is transmitted by the amplifier.

11. A method for digital predistortion for an amplifier, the method comprising:
    receiving one or more captures of a predistorted input signal and an output signal of the amplifier;
    retrieving regularization data corresponding to a wideband input signal and a wideband output signal of the amplifier; and
    determining coefficients for predistorting an input signal to the amplifier based on the one or more captures and the regularization data.

12. The method of claim 11, wherein the regularization data is pre-stored data representing input and output signals received and output respectively by the amplifier during wideband operation of the amplifier.

13. The method of claim 11, wherein the regularization data is pre-stored data representing wideband input and output signals received and output respectively by the amplifier as if the amplifier was linear.

14. The method of claim 11, further comprising:
    transmitting a wideband signal through the amplifier while the amplifier is not transmitting normal data traffic; and
    storing, as the regularization data, a capture of the wideband signal and the output signal of the amplifier while the amplifier is transmitting the wideband signal.

15. The method of claim 11, further comprising:
    providing normal data traffic as input to the amplifier;
    detecting that the normal data traffic is or is close to being a wideband signal; and
    storing, as the regularization data, a capture of the wideband signal and the output signal of the amplifier while the amplifier is transmitting the wideband signal.

16. The method of claim 11, further comprising:
    retrieving one or more capture covariance matrices formed from the one or more captures; and retrieving a regularization covariance matrix formed from the regularization data.

17. The method of claim 16, further comprising:
combining the one or more capture covariance matrices and the regularization covariance matrix into a joint matrix.

18. The method of claim 16, further comprising:
combining the one or more capture covariance matrices and the regularization covariance matrix into a joint matrix based on a weighing factor.

19. The method of claim 11, further comprising:
predistorting input data to the amplifier based on the determined coefficients.

* * * * *